(12) United States Patent
Yukawa et al.

(10) Patent No.: US 11,695,324 B2
(45) Date of Patent: Jul. 4, 2023

(54) POWER CONVERTER AND MOVING BODY

(71) Applicant: Panasonic Intellectual Property Management Co., Ltd., Osaka (JP)

(72) Inventors: Junichi Yukawa, Kanagawa (JP); Zenyou Tei, Kanagawa (JP); Hiroyuki Handa, Kanagawa (JP); Hideki Nakata, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 130 days.

(21) Appl. No.: 17/404,229

(22) Filed: Aug. 17, 2021

(65) Prior Publication Data

US 2022/0069699 A1 Mar. 3, 2022

(30) Foreign Application Priority Data

Aug. 25, 2020 (JP) .................................. 2020-141721

(51) Int. Cl.
*H02M 7/217* (2006.01)
*H02M 1/32* (2007.01)

(52) U.S. Cl.
CPC ........... *H02M 1/327* (2021.05); *H02M 7/217* (2013.01)

(58) Field of Classification Search
CPC ............................. H02M 1/327; H02M 7/217
See application file for complete search history.

(56) References Cited

U.S. PATENT DOCUMENTS 9,877,419 B2 * 1/2018 Suzuki ..................... H05K 5/02
2022/0077792 A1 * 3/2022 Kurokawa ............ H02M 3/003

FOREIGN PATENT DOCUMENTS

JP 2001-352767 A 12/2001

* cited by examiner

*Primary Examiner* — Adolf D Berhane
(74) *Attorney, Agent, or Firm* — Seed IP Law Group LLP

(57) ABSTRACT

A power converter according to the present disclosure includes a cooling plate and a plurality of circuit elements. The cooling plate includes a first cooling surface and a second cooling surface on an opposite side from the first cooling surface. The cooling plate is provided with a through hole passing through between the first and second cooling surfaces. The circuit elements convert AC power supplied from an external power source into DC power of a certain voltage and output the DC power. The circuit elements at least include first and second circuit elements. The first circuit element includes a first terminal and is thermally connected to the first cooling surface. The second circuit element includes a second terminal electrically connected to the first terminal and inserted into the through hole, and is thermally connected to the second cooling surface.

20 Claims, 6 Drawing Sheets

POWER CONVERTER AND MOVING BODY

CROSS-REFERENCE TO RELATED APPLICATIONS

This application is based upon and claims the benefit of priority from Japanese Patent Application No. 2020-141721, filed on Aug. 25, 2020, the entire contents of which are incorporated herein by reference.

FIELD

Embodiments described herein relate generally to a power converter and a moving body.

BACKGROUND

To address an increase in heat generation loss accompanied with capacity enlargement and an increase in heat generation density accompanied with size reduction of a power converter, technology for cooling the power converter by a liquid cooling method of performing cooling by using coolant such as water has conventionally been known. For example, Japanese Patent Application Laid-open No. 2001-352767 discloses a configuration in which elements such as switching circuits requiring cooling are mounted on a cooling plate.

In these circumstances, the cooling plate can be reduced in size and also the mounting density of elements requiring cooling can be reduced, by mounting the elements requiring cooling on both surfaces of the cooling plate, for example. However, an amount of wiring electrically connecting elements may increase by mounting the elements requiring cooling on both surfaces of the cooling plate. When the amount of wiring increases, noise generated from switching circuits is likely to be diffused. Thus, the cooling plate is limited in size reduction in some cases.

The present disclosure provides a power converter and a moving body that can reduce a cooling plate in size.

SUMMARY

A power converter according to the present disclosure includes a cooling plate and a plurality of circuit elements. The cooling plate includes a first cooling surface and a second cooling surface on an opposite side from the first cooling surface. The cooling plate is provided with a through hole passing through between the first and second cooling surfaces. The plurality of circuit elements are configured to convert AC power supplied from an external power source into DC power of a certain voltage and output the DC power. The plurality of circuit elements at least include first and second circuit elements. The first circuit element includes a first terminal and is thermally connected to the first cooling surface. The second circuit element includes a second terminal electrically connected to the first terminal and inserted into the through hole, and is thermally connected to the second cooling surface.

DETAILED DESCRIPTION

The following describes an embodiment of a power converter and a moving body according to the present disclosure with reference to the accompanying drawings.

Figure 1:
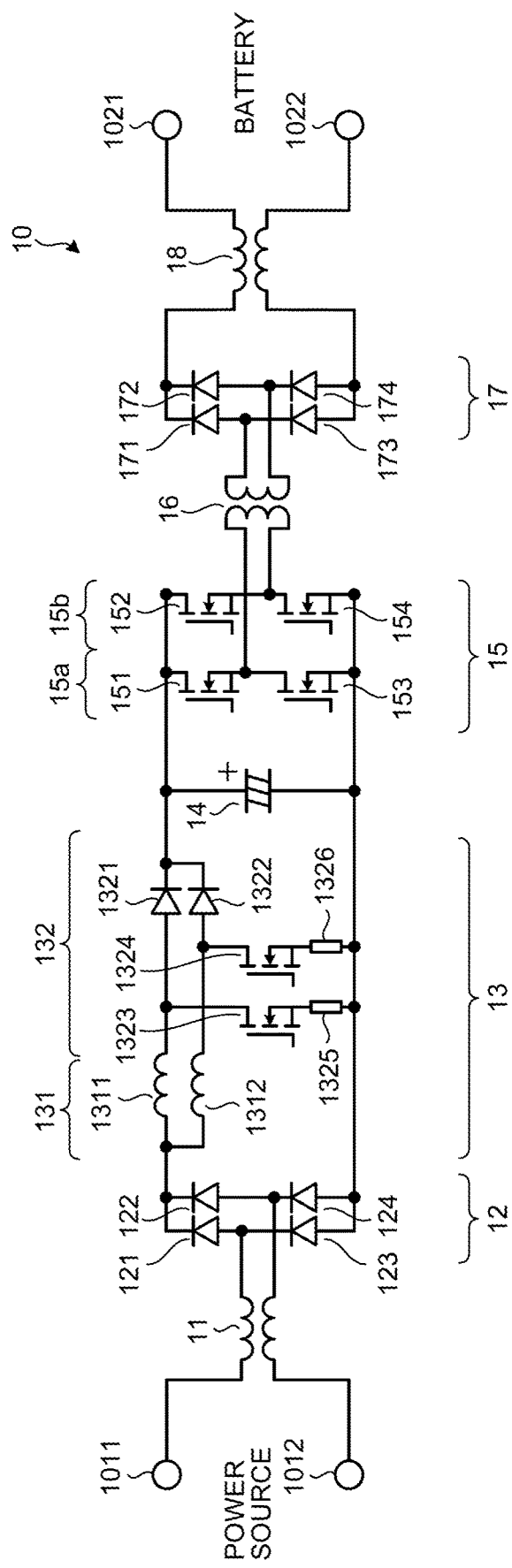
FIG. 1 is a diagram illustrating an example of a circuit configuration of a power converter according to an embodiment.

FIG. 1 is a diagram illustrating an example of a circuit configuration of a power converter 10 according to the embodiment.

The power converter 10 according to the embodiment is a charger that converts AC power supplied from a power source (an external power source) to input terminals 1011 and 1012 into DC power and supplies the DC power from output terminals 1021 and 1022 to a battery. The power source generates 200 V AC power, for example. To the battery, 400 V power is supplied, for example. As the battery, a lithium-ion battery can be used, for example. The following description may refer to the power source side as an upstream side and refer to the battery side as a downstream side.

As illustrated in FIG. 1, the power converter 10 has a line filter 11, a first rectifier circuit 12, a power factor correction (PFC) circuit 13, a smoothing capacitor 14, an LLC switching circuit 15, an LLC transformer 16, a second rectifier circuit 17, and a reactor 18. The line filter 11, the first rectifier circuit 12, the PFC circuit 13, the smoothing capacitor 14, the LLC switching circuit 15, the LLC transformer 16, the second rectifier circuit 17, the reactor 18, and these components are examples of a plurality of circuit elements.

The line filter 11 is an active filter (ACF) preventing noise entry from the power source to the power converter 10 and noise outflow from the power converter 10 to the power source. The line filter 11 is also referred to as a common mode noise filter (CMNF). The upstream side of the line filter 11 is electrically connected to the input terminals 1011 and 1012. One end of the downstream side of the line filter 11 is electrically connected to between an anode of a diode 121 and a cathode of a diode 123. The other end of the downstream side of the line filter 11 is electrically connected to between an anode of a diode 122 and a cathode of a diode 124.

The first rectifier circuit 12 converts AC power from the line filter 11 into DC power to supply the DC power to the PFC circuit 13. The first rectifier circuit 12 has the diodes 121, 122, 123, and 124. The anode of the diode 121 is electrically connected to the cathode of the diode 123. The anode of the diode 122 is electrically connected to the cathode of the diode 124. Cathodes of the diodes 121 and 122 are electrically connected to the upstream side of a PFC coil 131. Anodes of the diodes 123 and 124 are electrically connected to sources of negative-channel metal oxide semiconductor (NMOS) transistors 153 and 154.

The PFC circuit 13 is a booster circuit to improve a power factor and to suppress reactive power. The PFC circuit 13 has a PFC coil 131 and a switching circuit 132.

The PFC coil 131 has coils 1311 and 1312. The downstream side of the coil 1311 is electrically connected to an anode of a diode 1321. The downstream side of the coil 1312 is electrically connected to an anode of a diode 1322.

The switching circuit 132 has the diodes 1321 and 1322, NMOS transistors 1323 and 1324, and resistors 1325 and 1326. Cathodes of the diodes 1321 and 1322 are electrically connected to drains of NMOS transistors 151 and 152. A drain of the NMOS transistor 1323 is electrically connected to between the downstream side of the coil 1311 and the anode of the diode 1321. A drain of the NMOS transistor 1324 is electrically connected to between the downstream side of the coil 1312 and the anode of the diode 1322. A source of the NMOS transistor 1323 is electrically connected to between the anodes of the diodes 123 and 124 and the sources of the NMOS transistors 153 and 154 via the resistor 1325. A source of the NMOS transistor 1324 is electrically connected to between the anodes of the diodes 123 and 124 and the sources of the NMOS transistors 153 and 154 via the resistor 1326. Gates of the NMOS transistors 1323 and 1324 are electrically connected to a control circuit not illustrated.

The smoothing capacitor 14 smoothens power supplied from the PFC circuit 13 to the LLC switching circuit 15. One end of the smoothing capacitor 14 is electrically connected to between the cathodes of the diodes 1321 and 1322 and the drains of the NMOS transistors 151 and 152. The other end of the smoothing capacitor 14 is electrically connected to between the anodes of the diodes 123 and 124 and the sources of the NMOS transistors 153 and 154.

The LLC switching circuit 15 has the NMOS transistors 151, 152, 153, and 154. The LLC switching circuit 15 resonantly drives the LLC transformer 16 with a leakage inductance of a transformer not illustrated and the resonance of a capacitor not illustrated. The LLC switching circuit 15 suppresses the occurrence of a surge or the like by the NMOS transistors 151, 152, 153, and 154, which transitions to an ON state at a timing of current 0 (zero) or the like.

A source of the NMOS transistor 151 is electrically connected to a drain of the NMOS transistor 153. A source of the NMOS transistor 152 is electrically connected to a drain of the NMOS transistor 154.

The LLC transformer 16 is an isolation transformer. One end of the upstream side of the LLC transformer 16 is electrically connected to between the source of the NMOS transistor 151 and the drain of the NMOS transistor 153. The other end of the upstream side of the LLC transformer 16 is electrically connected to between the source of the NMOS transistor 152 and the drain of the NMOS transistor 154. One end of the downstream side of the LLC transformer 16 is electrically connected to between an anode of a diode 171 and a cathode of a diode 173. The other end of the downstream side of the LLC transformer 16 is electrically connected to between an anode of a diode 172 and a cathode of a diode 174.

The second rectifier circuit 17 converts AC power from the LLC transformer 16 into DC power and supplies the DC power to the reactor 18. The second rectifier circuit 17 has the diodes 171, 172, 173, and 174. The anode of the diode 171 is electrically connected to the cathode of the diode 173. The anode of the diode 172 is electrically connected to the cathode of the diode 174. Cathodes of the diodes 171 and 172 are electrically connected to one end of the upstream side of the reactor 18. Anodes of the diodes 173 and 174 are electrically connected to the other end of the upstream side of the reactor 18.

The reactor 18, for the DC power from the second rectifier circuit 17, removes waveform fluctuations, that is, ripples that have not completely been removed by the smoothing capacitor 14 and supplies the DC power from which the ripples have been removed to the battery. The downstream side of the reactor 18 is electrically connected to the output terminals 1021 and 1022.

Figure 2:
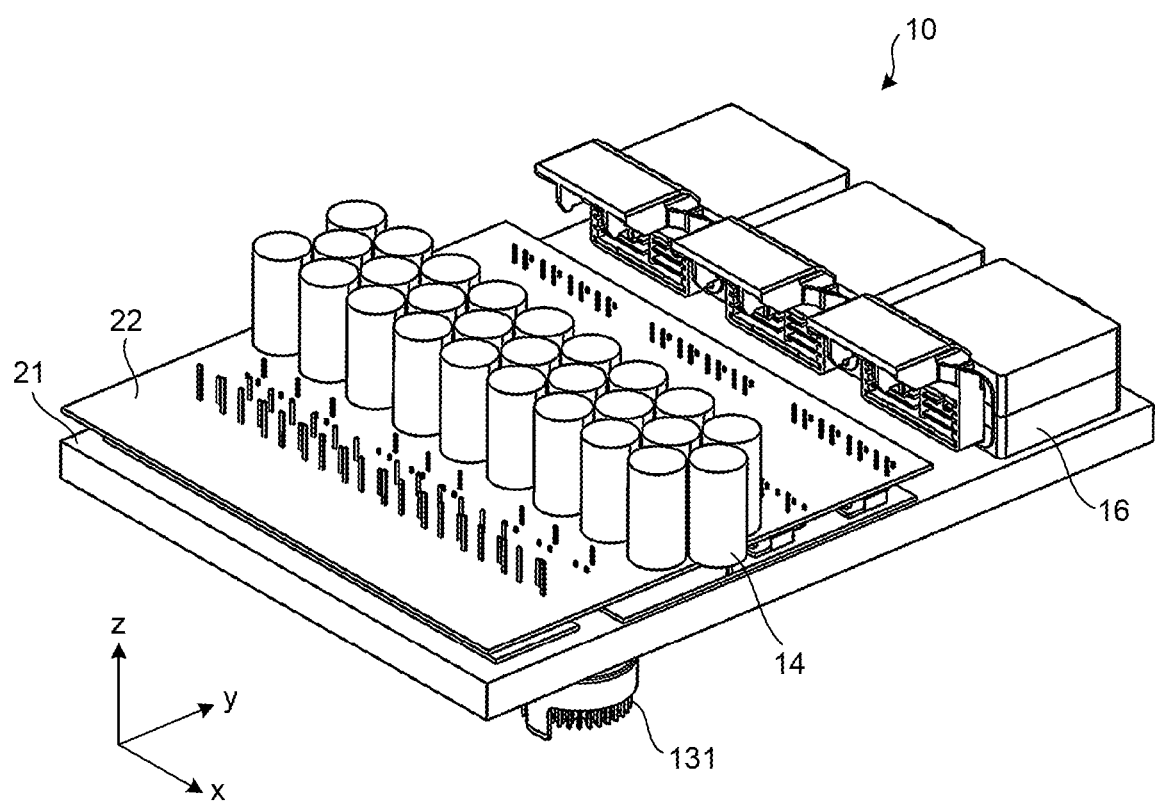
FIG. 2 is a perspective view illustrating a schematic configuration of the power converter according to the embodiment.

FIG. 2 is a perspective view illustrating a schematic configuration of the power converter 10 according to the embodiment. As illustrated in FIG. 2, the power converter 10 according to the embodiment has a cooling plate 21 and a printed circuit board (PCB) 22.

Figure 3:
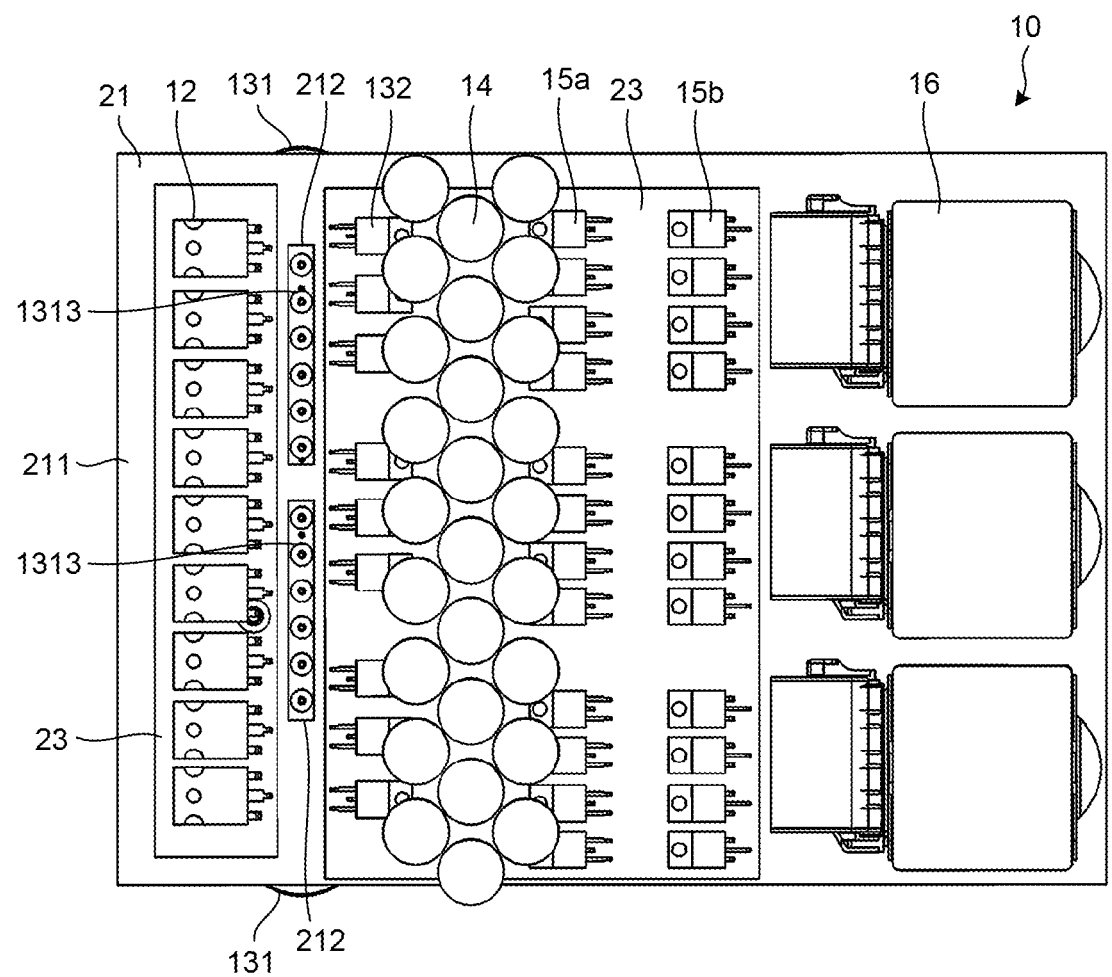
FIG. 3 is a top view illustrating the schematic configuration of the power converter in FIG. 2 with a printed circuit board unillustrated.
Figure 3:
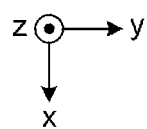

FIG. 3 is a top view illustrating the schematic configuration of the power converter 10 in FIG. 2 with the printed circuit board 22 unillustrated. In the configuration exemplified in FIG. 3, the first rectifier circuit 12, the switching circuit 132 of the PFC circuit 13, LLC switching circuits 15a and 15b, and the LLC transformer 16 are placed on an upper face 211 of the cooling plate 21 in such a manner as to be capable of exchanging heat with the cooling plate 21 via a thermal diffusion plate 23. In other words, the first rectifier circuit 12, the switching circuit 132 of the PFC circuit 13, the LLC switching circuits 15a and 15b, and the LLC transformer 16 are thermally connected to the upper face 211 of the cooling plate 21. The upper face 211 of the cooling plate 21 is an example of a first cooling plate. The first rectifier circuit 12, the switching circuit 132 of the PFC circuit 13, the LLC switching circuits 15a and 15b, and the LLC transformer 16 are each an example of a first circuit element.

Figure 4:
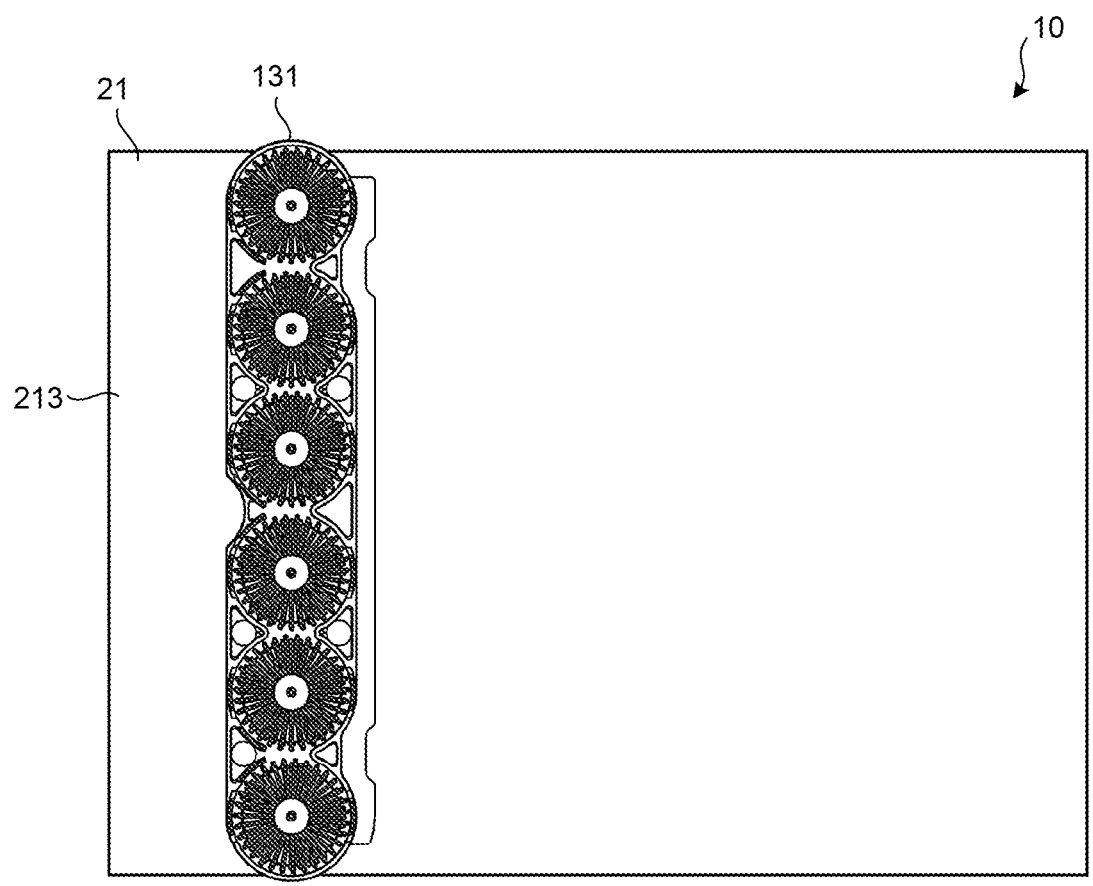
FIG. 4 is a bottom view illustrating the schematic configuration of the power converter in FIG. 2.

FIG. 4 is a bottom view illustrating the schematic configuration of the power converter 10 in FIG. 2. In the configuration exemplified in FIG. 4, PFC coils 131 of the PFC circuit 13 are placed on a bottom face 213, which is on an opposite side of the cooling plate 21 from the upper face 211, in such a manner as to be capable of exchanging heat with the cooling plate 21 via a thermal diffusion plate not illustrated. In other words, the PFC coils 131 are thermally connected to the bottom face 213 of the cooling plate 21. The PFC coil 131 of the PFC circuit 13 has an input/output terminal 1313. As illustrated in FIG. 3, the input/output terminal 1313 is inserted into a through hole 212 of the cooling plate 21. The bottom face 213 of the cooling plate 21 is an example of a second cooling surface. The PFC coil 131 is an example of a second circuit element. The input/output terminal 1313 of the PFC coil 131 is an example of a second terminal.

On which side of the cooling face of the cooling plate 21 each of the circuit elements of the power converter 10 is placed can be optionally designed. As an example, the length of an input/output terminal of a circuit element placed on the cooling face of the cooling plate 21 on a side of the printed circuit board 22 is shorter than the length of an input/output terminal of a circuit element placed on the cooling face of the cooling plate 21 on an opposite side from the printed circuit board 22. Specifically, circuit elements having short terminals such as a diode and a field effect transistor (FET) may preferentially be placed on the cooling face of the cooling plate 21 on a side of the printed circuit board 22.

Figure 5:
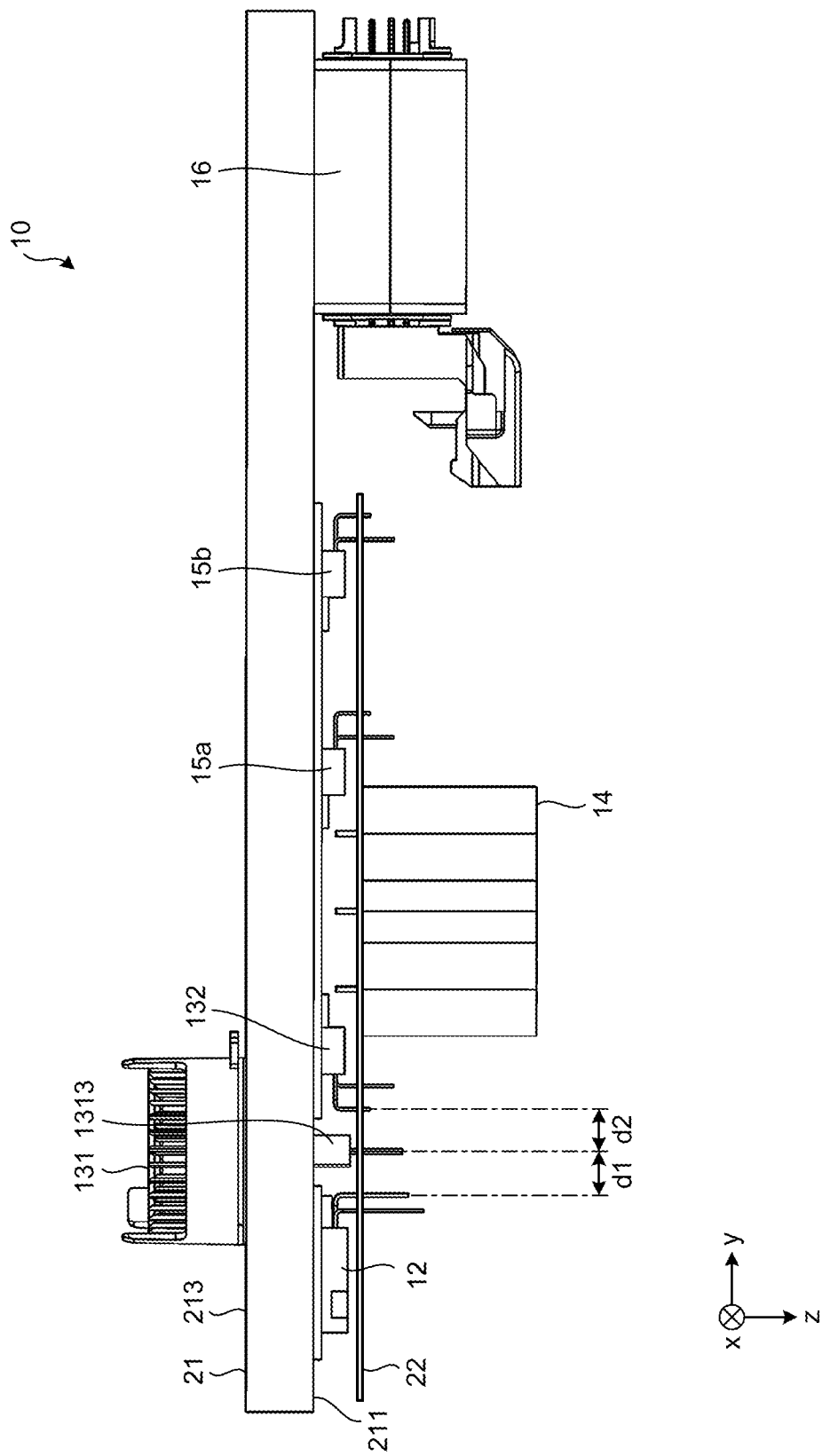
FIG. 5 is a front view illustrating the schematic configuration of the power converter in FIG. 2.

FIG. 5 is a front view illustrating the schematic configuration of the power converter 10 in FIG. 2. The printed circuit board 22 is provided on one side of the cooling faces on both sides of the cooling plate 21. In the example illustrated in FIG. 2 and FIG. 5, the printed circuit board 22 is placed close to the upper face 211 of the cooling plate 21. As illustrated in FIG. 5, the printed circuit board 22 is electrically connected to respective input/output terminals (first terminals and second terminals) of the first rectifier circuit 12, the PFC circuit 13, the smoothing capacitor 14, the LLC switching circuits 15a and 15b, and the LLC transformer 16. In other words, electric connections between the respective circuit elements placed on the cooling faces on both sides of the cooling plate 21 and the printed circuit board 22 are gathered to one side when viewed from the cooling plate 21. The printed circuit board 22 is an example of a connecting member.

The circuit elements of the power converter 10 are placed on the cooling faces of the cooling plate 21 with a positional relation between the circuit elements specified by a circuit diagram like the one illustrated in FIG. 1, for example. That is to say, the placement of the circuit elements on the cooling plate 21 in the power converter 10 according to the embodiment is preferably implemented such that the distance between the terminals of the circuit elements adjacent to each other is as short as possible along a power line. In the example illustrated in FIG. 5, for example, a distance d1 between the output terminal of the first rectifier circuit 12 and the input/output terminal 1313 of the PFC coil 131 on the printed circuit board 22 is a connectable shortest distance in accordance with the size of each of the circuit elements, which is specified by the distance on the power line of the circuit diagram illustrated in FIG. 1. In the example illustrated in FIG. 5, for example, a distance d2 between the input/output terminal 1313 of the PFC coil 131 and the input terminal of the switching circuit 132 on the printed circuit board 22 is also specified in a similar way.

Although the present embodiment exemplifies the printed circuit board 22 as an example of the connecting member, this is not limiting. As the connecting member, members such as a bus bar and a copper plate can also be used as appropriate.

Figure 6:
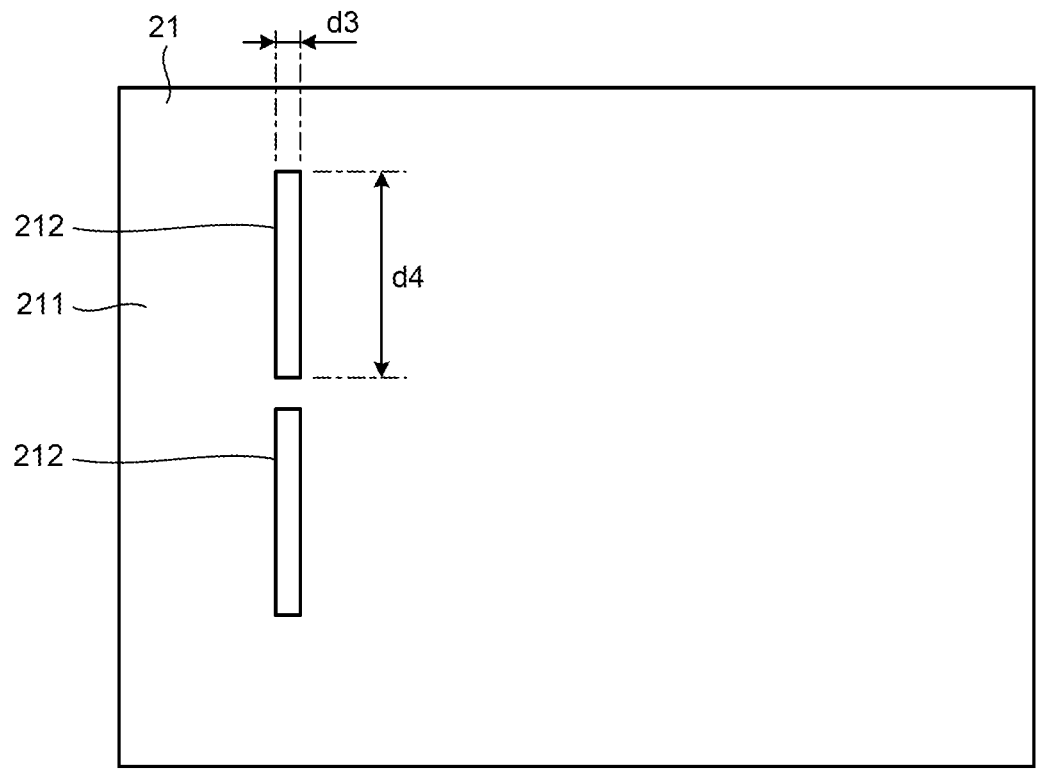
FIG. 6 is a top view illustrating a schematic configuration of a cooling plate in FIG. 2.
Figure 6:
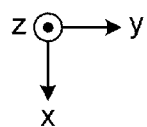

FIG. 6 is a top view illustrating the schematic configuration of the cooling plate 21 in FIG. 2. The cooling plate 21 has a coolant channel not illustrated therewithin. The channel within the cooling plate 21 may be formed by any method. As an example, the cooling plate 21 having a channel therewithin can be formed by low-pressure casting. As another example, the cooling plate 21 having a channel therewithin can be formed by joining two plate-like members formed with a channel-shaped groove together by brazing. As another example, the cooling plate 21 having a channel therewithin can be formed by machining on a plate-like member. As another example, the cooling plate 21 having a channel therewithin can be formed by a 3D-printer discharging metallic powder. x-y planes on both sides of the cooling plate 21 are formed as cooling faces capable of exchanging heat with the coolant. Each of the circuit elements that require cooling is placed on either cooling face of both the cooling faces of the cooling plate 21 in such a manner as to be capable of exchanging heat with the cooling plate 21. In other words, each of the circuit elements that require cooling is placed on either cooling face of both the cooling faces of the cooling plate 21 to be thermally connected to the cooling face on which the circuit element is placed. As illustrated in FIG. 6, the cooling plate 21 is provided with through holes 212 passing through between the upper face 211 and the bottom face 213 of the cooling plate 21 in a z direction.

The through hole 212 is provided at a position at which a contact between the input/output terminal of the circuit element placed on the cooling face of the cooling plate 21 on the opposite side from the printed circuit board 22 and the printed circuit board 22 is projected onto the cooling plate 21 from the printed circuit board 22. In the example illustrated in FIG. 5, the through hole 212 is provided in an area of the cooling plate 21 positioned immediately below a contact between the input/output terminal 1313 of the PFC coil 131 and the printed circuit board 22.

A width d3 of the through hole 212 is larger than an insulating part of the input/output terminal of the circuit element placed on the cooling face of the cooling plate 21 on the opposite side from the printed circuit board 22. In the example illustrated in FIG. 5, the width d3 of the through hole 212 is larger than the diameter of a covering member of the input/output terminal 1313 of the PFC coil 131. It is assumed that the diameter of the covering member provided on the input/output terminal 1313 is determined in accordance with an insulating distance. The width d3 of the through hole 212 is preferably a width slightly larger than the diameter of the covering member of the input/output terminal. In this case, the cooling plate 21 can support the input/output terminal inserted into the through hole 212 by wall faces of the through hole 212. The cooling plate 21 can also be used as a positioning member when the input/output terminal is mounted on the printed circuit board 22. A length d4 of the through hole 212 and the number of the through holes 212 may be set as appropriate in accordance with the positions and the number of the circuit elements placed on the cooling face of the cooling plate 21 on the opposite side from the printed circuit board 22.

Although the present embodiment exemplifies the cooling plate 21 of a liquid cooling method, this is not limiting. The technique according to the present disclosure can also be implemented by the cooling plate 21 of an air cooling system or a system including a heat sink.

For a large circuit element such as the smoothing capacitor 14, not only the input/output terminal thereof but also the circuit element may be inserted into the through hole 212 provided in the cooling plate 21. Thus, the power converter 10 can be reduced in size.

The power converter 10 according to the present embodiment can be used for various power electronics such as a DC-DC converter, an AC-DC converter, and a DC-AC converter.

As described above, the power converter 10 coverts the input AC power into the DC power by the first rectifier circuit 12 and then boosts the converted DC power by the PFC circuit 13 for the purpose of power factor improvement. The power converter 10, for the boosted DC power, drives the LLC transformer 16 by the LLC switching circuit 15 via the smoothing capacitor 14. Subsequently, the power converter 10 converts the AC power from the LLC transformer 16 into the DC power by the second rectifier circuit 17 to charge the battery. The circuit scale of the power converter 10 is large because of the requirement of such multistage conversion.

Output power required for the power converter 10 is increasing along with an increase in battery capacity in recent years. When the output power increases, the power converter 10 increases in heat generation loss. Furthermore, when the power converter 10 is an on-vehicle charger, for example, heat generation density increases along with size reduction for the purpose of improving mountability. Because of these circumstances, the liquid cooling method such as water cooling, which is larger than the air cooling system in cooling performance, is preferably employed in some cases.

Given these circumstances, when the liquid cooling method is employed, circuit elements that require cooling are mounted on a cooling plate provided with a coolant channel therewithin, and thus the power converter 10 increases in size in accordance with the circuit scale of the power converter 10. Examples of the circuit elements that require cooling include the first rectifier circuit 12, the PFC circuit 13, the smoothing capacitor 14, the LLC switching circuit 15, the LLC transformer 16, the second rectifier circuit 17, and the reactor 18. When the power converter 10 increases in size, mountability reduces.

When the circuit elements that require cooling are mounted on both cooling faces of the cooling plate, for example, the mounting density of the circuit elements that require cooling can be reduced, while the cooling plate is reduced in size. However, when the elements that require cooling are mounted on both surfaces of the cooling plate, the amount of routing of wiring electrically connecting the elements to each other may increase in some cases. When the amount of routing of the wiring increases, noise generated from the LLC switching circuit 15 and the switching circuit 132, for example, is likely to be diffused. Thus, in view of suppressing electromagnetic interference (EMI) noise, the cooling plate is limited in size reduction in some cases. When a circuit element to suppress the noise generated from the LLC switching circuit 15 and the switching circuit 132 is added, there is a possibility that the addition increases costs and reduces mountability.

The power converter 10 according to the embodiment has the cooling plate 21 provided with the through hole 212 and the printed circuit board 22 provided on one side of the cooling faces on both sides of the cooling plate 21. In the power converter 10, each of the circuit elements that require cooling is placed on either cooling face of both the cooling faces of the cooling plate 21 and is electrically connected to the printed circuit board 22. At least one circuit element mounted on the cooling face of the cooling faces on both sides of the cooling plate 21 on a side of the printed circuit board 22 is electrically connected to the printed circuit board 22. At least one circuit element mounted on the cooling face of the cooling faces on both sides of the cooling plate 21 on the opposite side from the printed circuit board 22 is electrically connected to the printed circuit board 22 via the through hole 212. In other words, in the power converter 10 according to the embodiment, electric connections between the circuit elements that require cooling include a connection via the through hole 212 of the cooling plate 21 and are gathered to one side of the cooling plate 21.

Thus, the power converter 10 of the embodiment can gather the electric connections between the circuit elements that require cooling to one side of the cooling plate 21. Thus, with the power converter 10 of the embodiment, the connection of the power lines for switching can be close to an ideal connection like the circuit configuration illustrated in FIG. 1, for example. In other words, the power converter 10 of the embodiment can suppress an increase in the amount of routing of the wiring electrically connecting the circuit elements to each other even when the circuit elements that require cooling are placed on the cooling faces on both sides of the cooling plate 21.

Thus, the power converter 10 of the embodiment can reduce the cooling plate in size while suppressing the occurrence of EMI noise. That is to say, many components can be housed in a casing of the small-sized power converter 10 while power flow of the power converter 10 as a charger is optimized to suppress the occurrence of EMI noise. In addition, an additional circuit configuration for EMI noise can be dispensed with, thereby contributing to a cost reduction.

APPLICATION EXAMPLE

Figure 7:
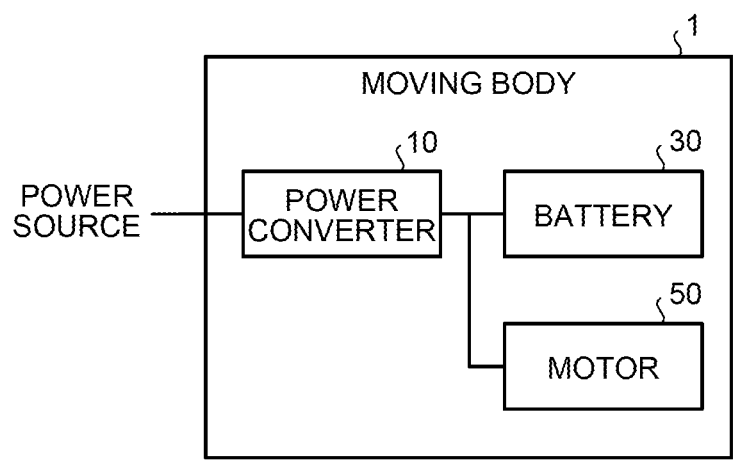
FIG. 7 is a diagram illustrating an example of a configuration of a moving body mounted with the power converter according to the embodiment.

FIG. 7 is a diagram illustrating an example of a configuration of a moving body 1 mounted with the power converter 10 according to the embodiment.

The moving body 1 according to the embodiment is any of various kinds of vehicles including a battery such as an electric vehicle and a hybrid vehicle, for example. As illustrated in FIG. 7, the moving body 1 has the power converter 10, a battery 30, and a motor 50.

The power converter 10 is an on-vehicle charger installed in the moving body 1. The power converter 10 is connected to an external power source, converts AC power supplied from the external power source into DC power of a certain voltage, and supplies the DC voltage to the battery 30 and/or the motor 50. The power converter 10 has been described in the above embodiment, and thus a description thereof is omitted here.

The battery 30 is a battery for driving the motor 50 installed in a vehicle, for example. As the battery 30, a lithium-ion battery can be used, for example. The motor 50 installed in the vehicle is a motor driven by power from the battery 30. The motor 50 may be a motor for causing the vehicle to travel or a motor for driving or operating various kinds of electric parts installed in the vehicle such as head lights, wipers, and audio equipment.

As the moving body 1, various kinds of vehicles such as a bicycle, a motorcycle, an automobile, and a train can be used as appropriate. The moving body 1 is not limited to these vehicles and may be any of various kinds of moving bodies including a battery such as a ship and an aircraft. The moving body 1 may be a moving body moving in a manned manner or a moving body moving in an unmanned manner. The movement of the moving body 1 may be controlled by a user or be controlled autonomously in accordance with a set delivery route or the like.

Thus, the moving body 1 of the embodiment is installed with the power converter 10. Thus, for an on-vehicle charger for which size reduction is required, both improvement in cooling performance and improvement in power density can be achieved.

The power converter according to the present disclosure can reduce the cooling plate in size.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A power converter comprising:
  a cooling plate including a first cooling surface and a second cooling surface on an opposite side from the first cooling surface, the cooling plate being provided with a through hole passing through between the first cooling surface and the second cooling surface; and
  a plurality of circuit elements at least comprising: a first circuit element including a first terminal and being thermally connected to the first cooling surface; and a second circuit element including a second terminal electrically connected to the first terminal and inserted into the through hole, the second circuit element being thermally connected to the second cooling surface, wherein the plurality of circuit elements are configured to convert AC power supplied from an external power source into DC power of a certain voltage and output the DC power.

2. The power converter according to claim 1, further comprising a connecting member placed close to the first cooling surface of the cooling plate and electrically connected to input/output terminals of the plurality of circuit elements including the first and second terminals.

3. The power converter according to claim 2, wherein
the connecting member and the first terminal are electrically connected to each other at a first contact,
the connecting member and the second terminal are electrically connected to each other at a second contact, and
the through hole of the cooling plate is provided immediately below the second contact.

4. The power converter according to claim 3, wherein a distance between the first and second contacts on the connecting member is a connectable shortest distance specified by a circuit diagram of the plurality of circuit elements.

5. The power converter according to claim 1, wherein the through hole of the cooling plate is larger than an insulating part of the second terminal.

6. The power converter according to claim 2, wherein the through hole of the cooling plate is larger than an insulating part of the second terminal.

7. The power converter according to claim 3, wherein the through hole of the cooling plate is larger than an insulating part of the second terminal.

8. The power converter according to claim 4, wherein the through hole of the cooling plate is larger than an insulating part of the second terminal.

9. The power converter according to claim 1, wherein the first terminal is shorter than the second terminal.

10. The power converter according to claim 2, wherein the first terminal is shorter than the second terminal.

11. The power converter according to claim 3, wherein the first terminal is shorter than the second terminal.

12. The power converter according to claim 4, wherein the first terminal is shorter than the second terminal.

13. The power converter according to claim 5, wherein the first terminal is shorter than the second terminal.

14. The power converter according to claim 1, wherein the cooling plate supports the second terminal by the through hole.

15. The power converter according to claim 2, wherein the cooling plate supports the second terminal by the through hole.

16. The power converter according to claim 3, wherein the cooling plate supports the second terminal by the through hole.

17. The power converter according to claim 4, wherein the cooling plate supports the second terminal by the through hole.

18. The power converter according to claim 5, wherein the cooling plate supports the second terminal by the through hole.

19. The power converter according to claim 6, wherein the cooling plate supports the second terminal by the through hole.

20. A moving body comprising:
a battery;
a motor driven by power from the battery; and
a power converter configured to convert AC power supplied from an external power source into DC power of a certain voltage to supply the DC power to the battery or the motor,
the power converter comprising:
a cooling plate including a first cooling surface and a second cooling surface on an opposite side from the first cooling surface, the cooling plate being provided with a through hole passing through between the first cooling surface and the second cooling surface; and
a plurality of circuit elements at least comprising: a first circuit element including a first terminal and being thermally connected to the first cooling surface; and a second circuit element including a second terminal electrically connected to the first terminal and inserted into the through hole, the second circuit element being thermally connected to the second cooling surface, wherein the plurality of circuit elements are configured to convert the AC power supplied from the external power source into the DC power of the certain voltage and output the DC power.

* * * * *